US012590852B2

(12) United States Patent
Sun

(10) Patent No.: US 12,590,852 B2
(45) Date of Patent: Mar. 31, 2026

(54) FORCE SENSOR WITH POLYMER MATERIAL LAYER

(71) Applicant: PixArt Imaging Inc., Hsin-Chu County (TW)

(72) Inventor: Chih-Ming Sun, Hsin-Chu County (TW)

( * ) Notice: Subject to any disclaimer, the term of this patent is extended or adjusted under 35 U.S.C. 154(b) by 201 days.

(21) Appl. No.: 18/207,680

(22) Filed: Jun. 9, 2023

(65) Prior Publication Data

US 2023/0332962 A1 Oct. 19, 2023

Related U.S. Application Data

(63) Continuation of application No. 17/130,103, filed on Dec. 22, 2020, now Pat. No. 11,733,109, which is a continuation of application No. 16/247,573, filed on Jan. 15, 2019, now Pat. No. 10,921,199.

(51) Int. Cl.
*G01L 1/14* (2006.01)
*H05K 1/03* (2006.01)
*H05K 1/11* (2006.01)

(52) U.S. Cl.
CPC ............ *G01L 1/144* (2013.01); *H05K 1/0393* (2013.01); *H05K 1/118* (2013.01); *H05K 2201/10151* (2013.01)

(58) Field of Classification Search
CPC ....... G01L 1/144; G01L 1/142; H05K 1/0393; H05K 1/118; H05K 2201/10151; H05K 1/162
See application file for complete search history.

(56) References Cited

U.S. PATENT DOCUMENTS

| | | | |
|---|---|---|---|
| 9,389,708 B2 | 7/2016 | Harjee | |
| 11,478,068 B2 | 10/2022 | Sun | |
| 11,761,830 B2 | 9/2023 | Chen | |
| 11,956,587 B2 | 4/2024 | Jeon | |
| 12,339,178 B2 | 6/2025 | Sun | |
| 2014/0210050 A1* | 7/2014 | Wang ................. | H10K 59/1216 |
| | | | 438/155 |
| 2016/0124554 A1* | 5/2016 | Lewis .................... | G09G 5/003 |
| | | | 345/174 |
| 2018/0266898 A1 | 9/2018 | Yoon | |
| 2020/0100013 A1 | 3/2020 | Harjee | |
| 2021/0219042 A1 | 7/2021 | Harjee | |

FOREIGN PATENT DOCUMENTS

| | | |
|---|---|---|
| CN | 203303184 | 11/2013 |
| CN | 106510881 | 3/2017 |
| CN | 111134885 | 5/2020 |
| CN | 111435101 | 7/2020 |
| JP | 2014115099 A | 6/2014 |
| KR | 20110124416 A | 11/2011 |
| TW | 201022421 A | 6/2010 |

* cited by examiner

*Primary Examiner* — Tarun Sinha
(74) *Attorney, Agent, or Firm* — Bruce Stone LLP; Joseph A. Bruce

(57) ABSTRACT

There is provided a force sensor including a substrate and a polymer material layer. The substrate has a circuit layout that includes a first electrode and a second electrode configured to form a capacitor therebetween. The polymer material layer covers at least on a space between the first electrode and the second electrode, and is used to change capacitance of the capacitor while being pressed.

16 Claims, 8 Drawing Sheets

200

200

200

200

200

211 23 213 21

25 F

231

211 215 21

23

25

213 217

700

800 providing a circuit board — S91 forming a drive electrode, a sensing electrode and traces respectively connecting to the drive electrode and the sensing electrode on the circuit board — S93 providing a polymer material layer — S95 overlapping the polymer material layer on the drive and sensing electrodes and adhering to the circuit board — S97

FORCE SENSOR WITH POLYMER MATERIAL LAYER

CROSS REFERENCE TO RELATED APPLICATION

This application is a continuation application of U.S. patent application Ser. No. 17/130,103 filed on Dec. 22, 2020, which is a continuation application of U.S. patent application Ser. No. 16/247,573 filed on Jan. 15, 2019, the full disclosures of which are incorporated herein by reference.

To the extent any amendments, characterizations, or other assertions previously made (in this or in any related patent applications or patents, including any parent, sibling, or child) with respect to any art, prior or otherwise, could be construed as a disclaimer of any subject matter supported by the present disclosure of this application, Applicant hereby rescinds and retracts such disclaimer. Applicant also respectfully submits that any prior art previously considered in any related patent applications or patents, including any parent, sibling, or child, may need to be re-visited.

BACKGROUND

1. Field of the Disclosure

This disclosure generally relates to a force sensor and, more particularly, to a capacitive force sensor having a simple manufacturing process and low cost, and a manufacturing method of the force sensor.

2. Description of the Related Art

Conventionally, a force sensor including a drive electrode and a sensing electrode is formed as an individual module. The drive electrode and the sensing electrode are then electrically connected to a circuit board via an additional connector.

For example, the force sensor provided in U.S. Patent Application No. 2017/0350771 A1 includes a top electrode 111, a bottom electrode 121 and a pair of force sensitive layers 112 and 122 to form an individual force sensor. The force sensor has to be connected to a driving circuit 222 and a sensing circuit 223 of a system 23 via a connector.

SUMMARY

The present disclosure provides a force sensor having a drive electrode and a sensing electrode directly laid, in the circuit board manufacturing process, on a circuit board without employing an additional connector, and a manufacturing method of the force sensor.

The present disclosure further provides a force sensor having a polymer material layer that is attachable and detachable repeatedly. When the polymer material layer is pressed, a dielectric constant thereof is changed accordingly.

The present disclosure provides a force sensor including a substrate, a polymer material layer, an adhesive layer and a carrying layer. The substrate is laid with a drive electrode and a sensing electrode on a surface thereof. The drive electrode and the sensing electrode are at a same layer on the surface of the substrate. The drive electrode has multiple first arc traces arranged in a radial direction. The sensing electrode has multiple second arc traces arranged in the radial direction. Each of the first arc traces is sandwiched between two second arc traces in the radial direction or each of the second arc traces is sandwiched between two first arc traces in the radial direction. The polymer material layer covers on the drive electrode and the sensing electrode, and is in contact with surfaces of the drive electrode and the sensing electrode. The adhesive layer is configured to adhere the polymer material layer to the substrate. The carrying layer is attached to a surface of the polymer material layer, and an area of the carrying layer is larger than that of the polymer material layer.

The present disclosure further provides a force sensor including a substrate, a polymer material layer, an adhesive layer and a carrying layer. The substrate is laid with a drive electrode and a sensing electrode on a surface thereof. The drive electrode and the sensing electrode are at a same layer on the surface of the substrate. The drive electrode has a first semi-circular trace and multiple first linear traces extending out from an inner edge of the first semi-circular trace. The sensing electrode has a second semi-circular trace and multiple second linear traces extending out from an inner edge of the second semi-circular trace. The multiple first linear traces and the multiple second linear traces are interlacedly arranged between the first semi-circular trace and the second semi-circular trace.

The polymer material layer covers on the drive electrode and the sensing electrode, and is in contact with surfaces of the drive electrode and the sensing electrode. The adhesive layer is configured to adhere the polymer material layer to the substrate. The carrying layer is attached to a surface of the polymer material layer, and an area of the carrying layer is larger than that of the polymer material layer.

The present disclosure further provides a force sensor including a substrate, a polymer material layer and an adhesive layer. The substrate is laid with multiple sets of drive electrodes and sensing electrodes on a surface thereof. The multiple sets of drive electrodes and sensing electrodes are at a same layer on the surface of the substrate, and each set of drive electrode and sensing electrode comprises interlaced drive traces and sensing traces. The polymer material layer adheres to the substrate and covers on the multiple sets of drive electrodes and sensing electrodes, and is in contact with surfaces of the multiple sets of drive electrodes and sensing electrodes. The adhesive layer is configured for adhering the polymer material layer to the substrate, and in contact with the surface of the substrate.

In the embodiments of the present disclosure, the substrate is a printed circuit board (PCB) or a flexible circuit board (FCB).

BRIEF DESCRIPTION OF THE DRAWINGS

Other objects, advantages, and novel features of the present disclosure will become more apparent from the following detailed description when taken in conjunction with the accompanying drawings.

DETAILED DESCRIPTION OF THE EMBODIMENT

It should be noted that, wherever possible, the same reference numbers will be used throughout the drawings to refer to the same or like parts.

Figure 1:
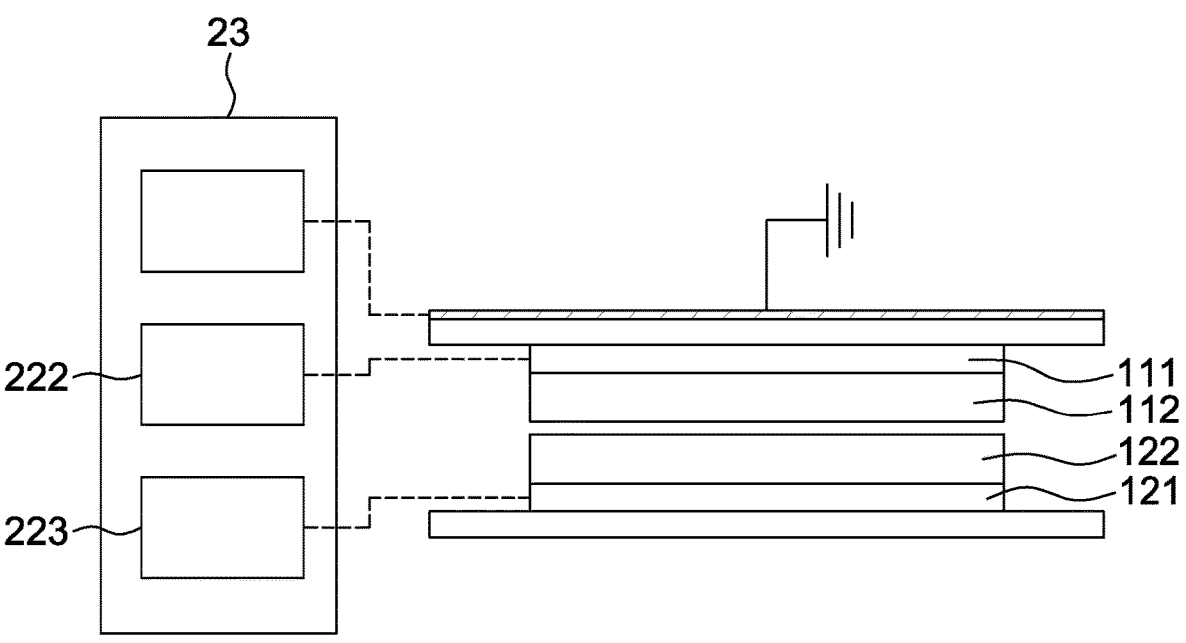
FIG. 1 is a schematic diagram of a conventional force sensor.
Figure 2A:
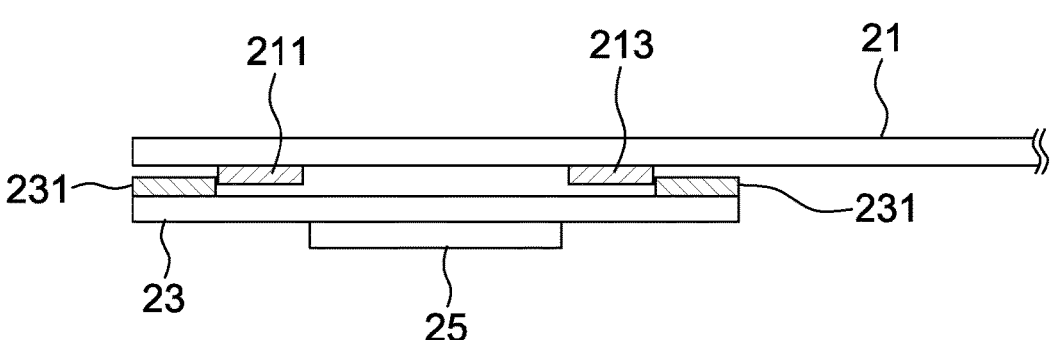
FIG. 2A is a schematic diagram of a force sensor, not being pressed, according to a first embodiment of the present disclosure.
Figure 2B:
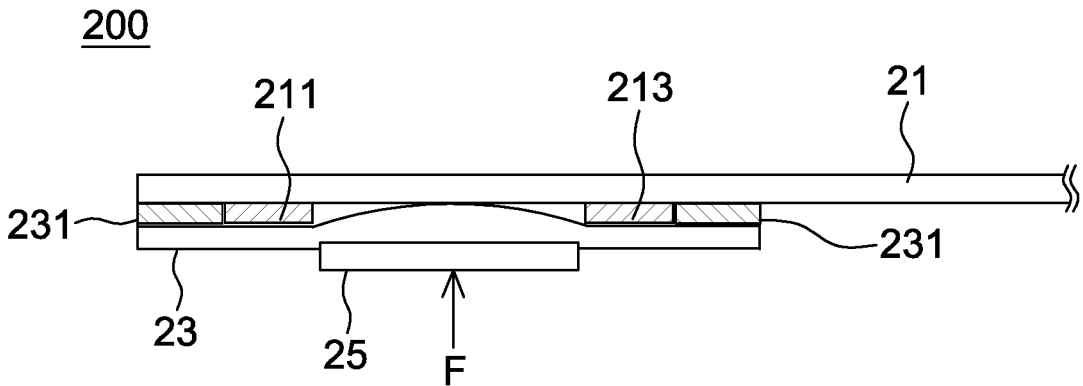
FIG. 2B is a schematic diagram of a force sensor, being pressed by a force, according to the first embodiment of the present disclosure.

Referring to FIGS. 2A and 2B, they are cross sectional views of a force sensor 200 according to a first embodiment of the present disclosure, wherein FIG. 2A shows the force sensor 200 not being pressed, and FIG. 2B shows the force sensor 200 being pressed by a force F such that a polymer material layer 23 is deformed upward. In the present disclosure, the polymer material layer 23 is selected from the material whose dielectric constant changes when the polymer material layer 23 is pressed by the force F. Accordingly, when the polymer material layer 23 is arranged between two electrodes supplied with electricity, capacitance of a capacitor between the two electrodes changes due to the change of the dielectric constant such that a force is detectable. For example, when the capacitance changes to exceed a threshold, a processor identifies that a force F is existing. In the present disclosure, said processor connects to the two electrodes via traces laid on the substrate 21.

In the present disclosure, a first surface (e.g., upper surface facing the substrate 21 in FIGS. 2A and 2B) of the polymer material layer 23 is not in contact with the substrate 21 or other circuits disposed on the substrate 21.

The force sensor 200 is applicable to various input devices that detect an input through detecting a press signal, e.g., a mouse, a keyboard, a remote controller, a touch pad or the like, but not limited to.

Figure 3:
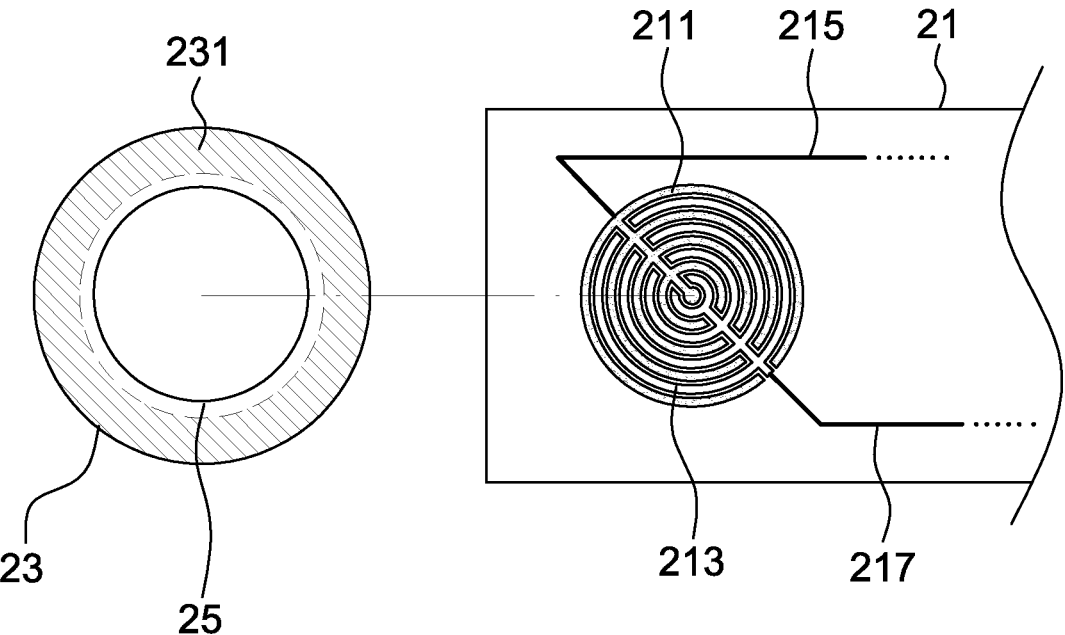
FIG. 3 is a top view of a force sensor according to one embodiment of the present disclosure.

Please referring to FIG. 3 together, it is a top view of a force sensor 200 according to one embodiment of the present disclosure. The force sensor 200 includes a substrate 21, a polymer material layer 23 and an adhesive layer 231. In some embodiments, the force sensor 200 further includes a bump 25 arranged on a second surface (FIGS. 2A-2B showing a bottom surface) of the polymer material layer 23 not facing the substrate 21. The bump 25 is used to allow an external force F to uniformly distribute on the polymer material layer 23, but the bump 25 is not necessary to be implemented. A cross sectional area of the bump 25 is selected to be equal to or smaller than the polymer material layer 23 without particular limitations. A surface of the bump 25 not attaching to the polymer material layer 23 is a curved surface or a plane surface. The bump 25 is made of plastic or glass. For example, the bump 25 is arranged opposite to a bottom of a button on the applied device to receive a force from the button.

The substrate 21 is, for example, a printed circuit board (PCB) or a flexible circuit board (FCB) without particular limitations. The substrate 21 has a layout circuit that includes a drive electrode 211 and a sensing electrode 213, as well as multiple traces (e.g., FIG. 3 showing two traces 215, 217, but not limited to) respectively connecting to the drive electrode 211 and the sensing electrode 213. The drive electrode 211 and the sensing electrode 213 are coplanar arranged. In other words, in manufacturing the substrate 21, said multiple traces (conductive lines such as copper lines, gold lines or silver lines) are laid on the substrate 21 together with the drive electrode 211 and the sensing electrode 213. In addition, electrical contacts for disposing other electronic devices, e.g., a processor and a driving circuit, are also manufactured on the substrate 21.

The polymer material layer 23 covers on the drive electrode 211 and the sensing electrode 213. In one aspect, the polymer material layer 23 also covers on a space (or air space) between the drive electrode 211 and the sensing electrode 213. When a force F is applied on the polymer material layer 23, a part of the polymer material layer 23 is squeezed into the space between the drive electrode 211 and the sensing electrode 213 to accordingly change capacitance of a capacitor therebetween. That is, in detecting a capacitance change between the drive electrode 211 and the sensing electrode 213, a distance (e.g., transverse distance in FIGS. 2A and 2B) between the drive electrode 211 and the sensing electrode 213 is not changed, and the capacitance change is caused by a change of electrical property of the polymer material layer 23 (even through without distortion) due to the external force F to change a detected signal of the sensing electrode 213. The polymer material layer 23 is selected from light transparent or opaque material without particular limitations.

The adhesive layer 231 is for adhering the polymer material layer 23 to the substrate 21. In one non-limiting embodiment, the adhesive layer 231 is arranged at an edge region of the polymer material layer 23 (as shown in FIG. 3) and adhering to a surface of the substrate 21. Accordingly, after the polymer material layer 23 is attached to the substrate 21, a capacitive force sensor is accomplished. As the electrode set (including drive and sensing electrodes) is directly manufactured on the surface of the substrate 21, said capacitive force sensor is not connected to the substrate 21 via an additional electrical connector.

In one non-limiting embodiment, the adhesive layer 231 is selected from the material that can be repeatedly attached and detached such that it is possible to remove the polymer material layer 23 from the substrate 21 and adhere the polymer material layer 23 to the substrate 21 again via the adhesive layer 231.

Figure 2C:
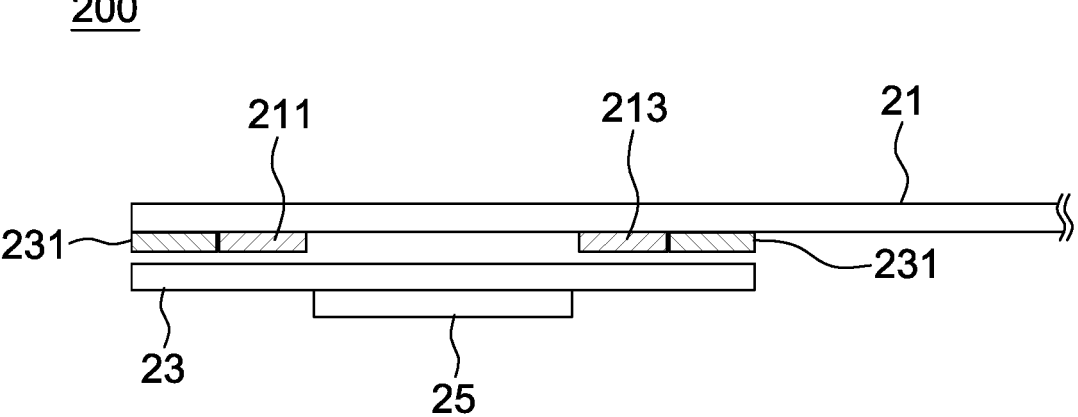
FIGS. 2C-2D are schematic diagrams of a force sensor according to some other embodiments of the present disclosure.

In some aspects, the adhesive layer 231 is firstly arranged on a surface of the substrate 21, as shown in FIG. 2C. The polymer material layer 23 is attachable to and detachable from the substrate 21 via the adhesive layer 231. For example, when the polymer material layer 23 is being removed from the substrate 21, the adhesive layer 231 is not removed at the same time.

Figure 2D:
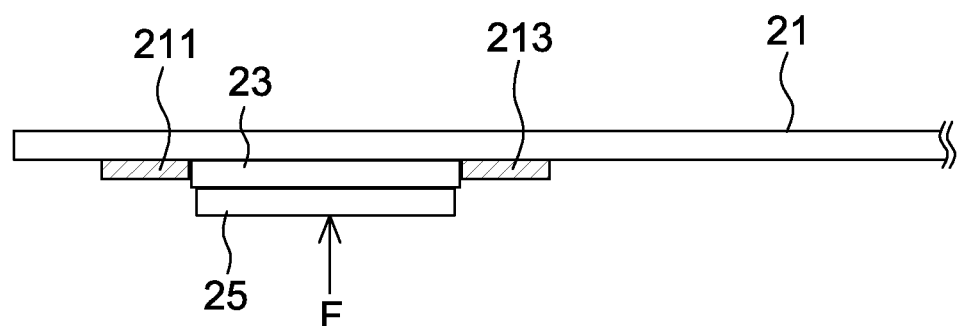

In alternative aspects, the polymer material layer 23 is directly printed or coated on a surface of the substrate 21 (covering the drive electrode 211 and the sensing electrode 213 or not) such that the adhesive layer 231 is omitted, as shown in FIG. 2D. In this case, an external force directly presses on the polymer material layer 23 or through a bump 25 to change the dielectric constant thereof.

Figure 4A:
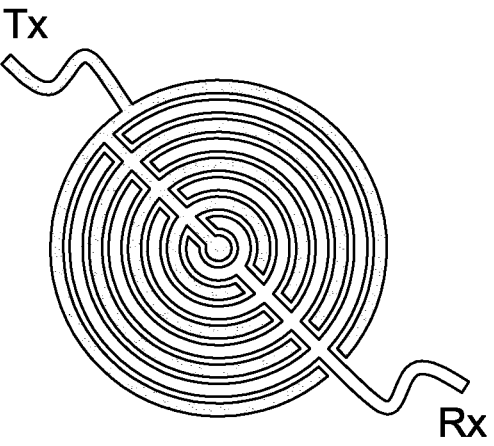
FIGS. 4A-4C are schematic diagrams of electrode patterns of a force sensor according to some embodiments of the present disclosure.
Figure 4B:
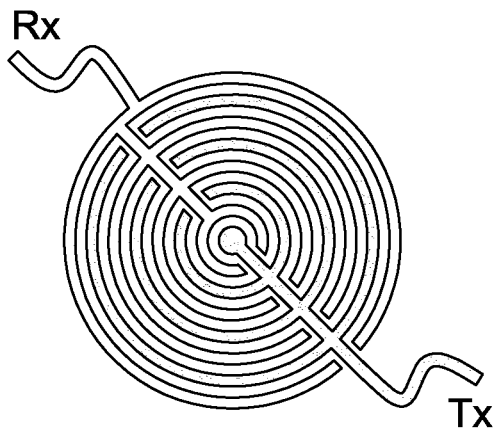
Figure 4C:
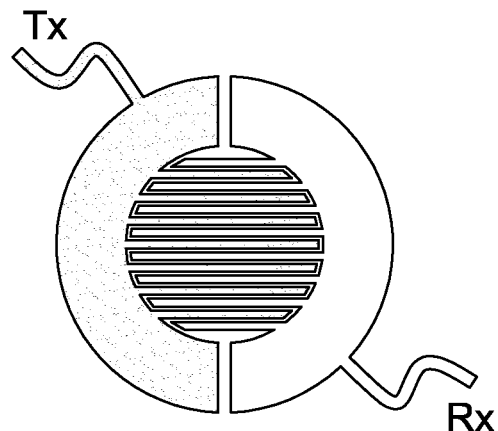

It should be mentioned that although FIGS. 2A and 2B only show one drive electrode 211 and one sensing electrode 213, it is only intended to simplify the drawing to show the distortion of the polymer material layer 23 while being pressed. However, it should be mentioned that the polymer material layer 23 is not necessary to be distorted to change the dielectric constant when the force F is pressing thereon. FIG. 2B is only intended to show a pressing state using the distortion of the polymer material layer 23 for easier understanding. In the present disclosure, the drive electrode Tx and the sensing electrode Rx are arranged properly, e.g. FIGS. 4A-4C showing different configurations, and preferably have a pitch therebetween within a predetermined distance range. The drive electrode Tx receives a drive signal via a trace (e.g., 215) from a driving circuit, and the sensing electrode Rx outputs a detected signal via a trace (e.g., 217) to a processor for identifying the pressing force.

In FIG. 4A, a drive electrode Tx and a sensing electrode Rx are arranged in a concentric circle, the electrode width is, for example, 200 micrometers and a pitch between the drive electrode Tx and the sensing electrode Rx is, for example, 150 micrometers. In FIG. 4B, a drive electrode Tx and a sensing electrode Rx are also arranged in a concentric circle, the electrode width is, for example, 150 micrometers and a pitch between the drive electrode Tx and the sensing electrode Rx is, for example, 250 micrometers. In FIG. 4C, a drive electrode Tx and a sensing electrode Rx are arranged as parallel straight lines, the electrode width is, for example, 200 micrometers and a pitch between the drive electrode Tx and the sensing electrode Rx is, for example, 200 micrometers.

Figure 7:
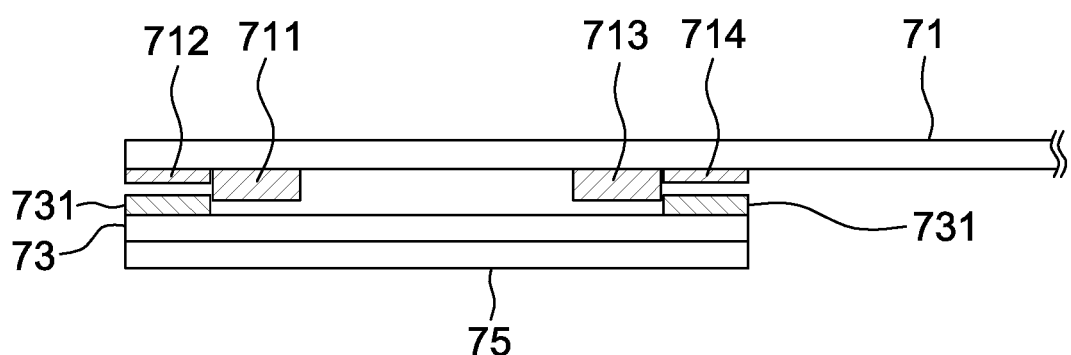
FIG. 7 is a cross sectional view of a force sensor according to a second embodiment of the present disclosure.

Referring to FIG. 7, it is a cross sectional view of a force sensor 700 according to a second embodiment of the present disclosure. The difference between the force sensor 700 and the force sensor 200 of FIG. 2A includes: (1) the substrate 71 of the force sensor 700 in FIG. 7 being further laid with metal layers 712, 714 during the substrate manufacturing process, and the metal layers 712, 714 being for adhering to the adhesive layer 731 to reduce a thickness of the adhesive layer 731; and (2) the bump 75 in FIG. 7 being shown to have a substantially identical size to the polymer material layer 73. The components of the force sensor 700 including the substrate 71, drive electrode 711, sensing electrode 713, adhesive layer 731 and polymer material layer 73 are identical to those of the first embodiment, and thus details thereof are not repeated herein.

Figure 8:
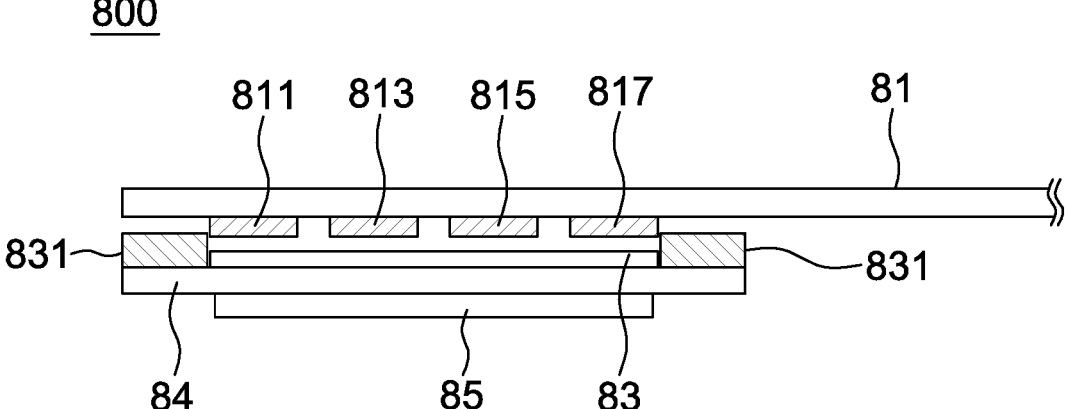
FIG. 8 is a cross sectional view of a force sensor according to a third embodiment of the present disclosure.

Referring to FIG. 8, it is a cross sectional view of a force sensor 800 according to a third embodiment of the present disclosure. The difference between the force sensor 800 and the force sensor 200 of FIG. 2A includes: (1) the force sensor 800 in FIG. 8 further including a carrying layer 84 attached to a surface (FIG. 8 showing a bottom surface) of the polymer material layer 83 not facing the substrate 81, and the carrying layer 84 being used to carry the polymer material layer 83; and (2) two sets of electrodes 811 and 813 as well as 815 and 817 being formed on the substrate 81 in FIG. 8. In this embodiment, an area of the carrying layer 84 is larger than that of the polymer material layer 83, and the adhesive layer 831 is arranged on the carrying layer 84. The material of the carrying layer 84 is selected to be identical to or different from that of the polymer material layer 83. In one non-limiting embodiment, the carrying layer 84 is an elastic plastic layer, a hard plastic layer or a double sided tape to combine the polymer material layer 83 and the bump 85. The components of the force sensor 800 including the substrate 81, drive electrodes 811 and 815, sensing electrodes 813 and 817, bump 85, adhesive layer 831 and polymer material layer 83 are identical to those of the first embodiment, and thus details thereof are not repeated herein.

Figure 5:
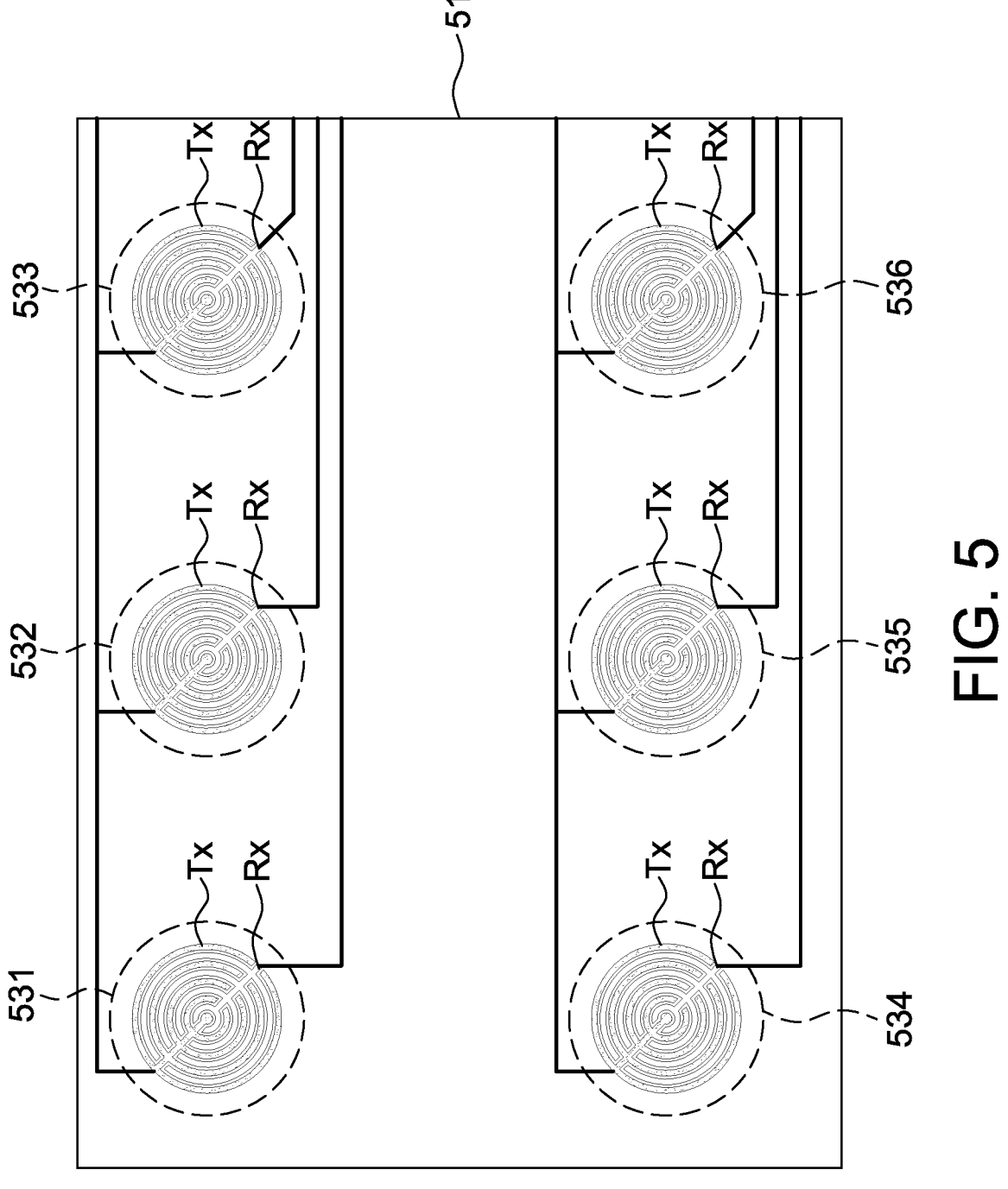
FIG. 5 is a configuration diagram of electrodes and polymer material layers of a force sensor according to one embodiment of the present disclosure.

Referring to FIG. 5, it is a configuration diagram of electrodes and polymer material layers of a force sensor according to one embodiment of the present disclosure. The substrate 51 is laid with multiple sets of drive electrodes Tx and sensing electrodes Rx, and also laid with a plurality of traces respectively connecting to the drive electrodes Tx and sensing electrodes Rx. Each set of drive electrode Tx and sensing electrode Rx is corresponding to one polymer material layer, e.g., 531-536 shown in FIG. 5, so as to form multiple force detecting points on the same substrate 51. The structure of each force detecting point is selected from FIG. 2A-3 or 7-8. The numbers and positions of the multiple force detecting points on the substrate 51 are determined according to actual applications as long as corresponding electrode sets are formed during manufacturing the circuit board. Multiple bumps are respectively arranged, optionally, on the polymer material layer 531-536 corresponding to each of the force detecting points.

Figure 6:
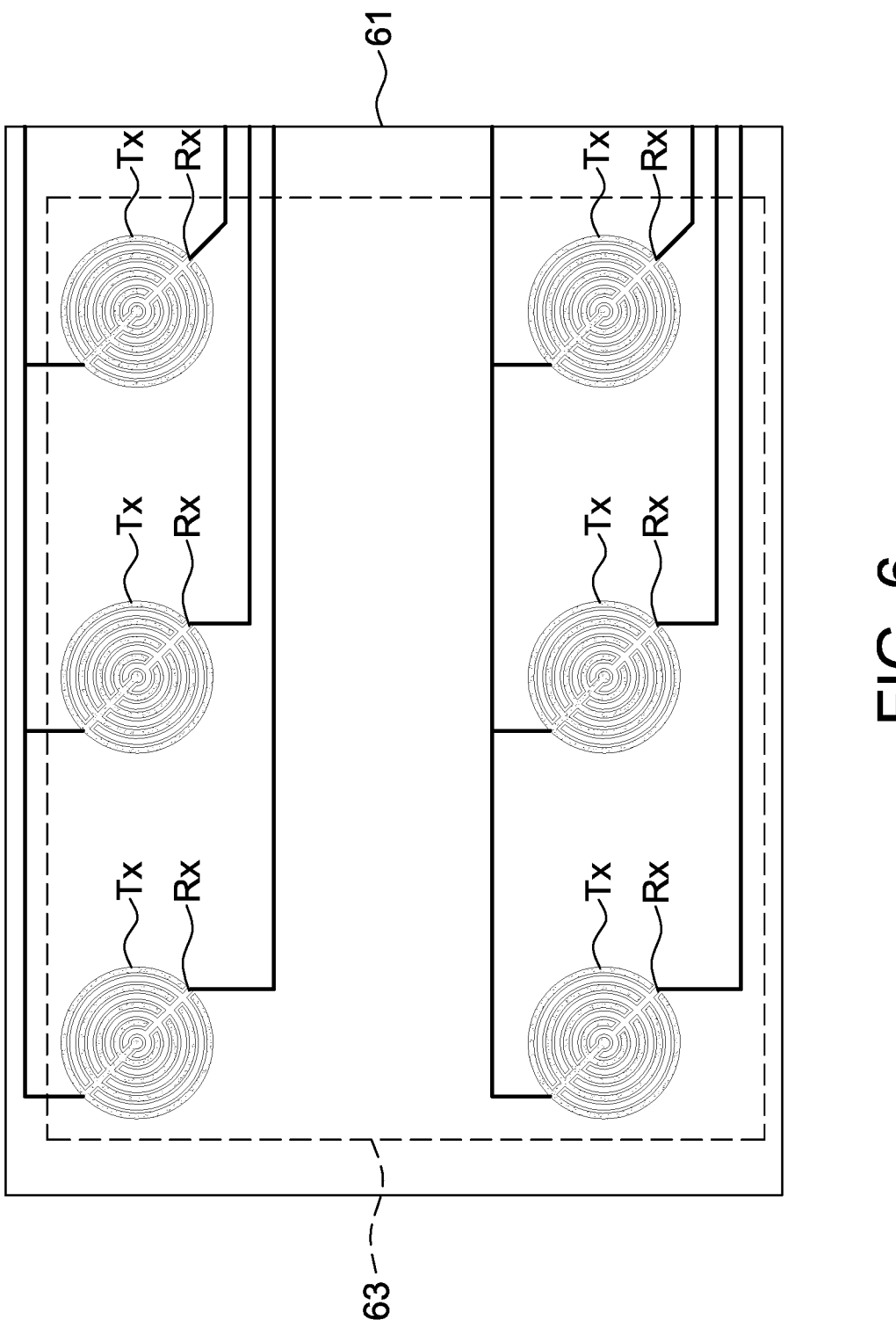
FIG. 6 is another configuration diagram of electrodes and a polymer material layer of a force sensor according to one embodiment of the present disclosure.

Referring to FIG. 6, it is another configuration diagram of electrodes and a polymer material layer of a force sensor according to one embodiment of the present disclosure. The force sensor also includes a substrate 61 and a polymer material layer 63. The substrate 61 has a circuit layout that includes multiple sets of drive electrodes Tx and sensing electrodes Rx, e.g., 6 sets of electrodes arranged in a matrix being shown in FIG. 6. The substrate 61 is further laid with a plurality of traces respectively connecting to the drive electrodes Tx and the sensing electrodes Rx.

In FIG. 6, the polymer material layer 63 is adhered to the substrate 61 and covering on the multiple sets of drive electrodes Tx and sensing electrodes Rx. The difference between FIG. 6 and FIG. 5 is that FIG. 6 employs one polymer material layer 63 to cover multiple electrode sets. Similarly, the polymer material layer 63 is adhered to the substrate 61 via an adhesive layer (not shown). In this embodiment, the adhesive layer is arranged surrounding and/or between the multiple electrode sets. The polymer material layer 63 is also attachable and detachable with the substrate 61.

Similarly, to allow an external force to distribute on the polymer material layer 63 uniformly, the force sensor in FIG. 6 further includes multiple bumps arranged on a surface of the polymer material layer 63 not facing the substrate 61, and each bump is corresponding to one set of drive electrode and sensing electrode, as shown in FIGS. 2A-3 and 7-8 for example. In one non-limiting embodiment, the force sensor in FIG. 6 further includes a carrying layer (as shown in FIG. 8) arranged on a surface of the polymer material layer 63 not facing the substrate 61. The carrying layer has the material identical to or different from the polymer material layer 63. If the carrying layer is used, it is an option to use the bump.

Figure 9:
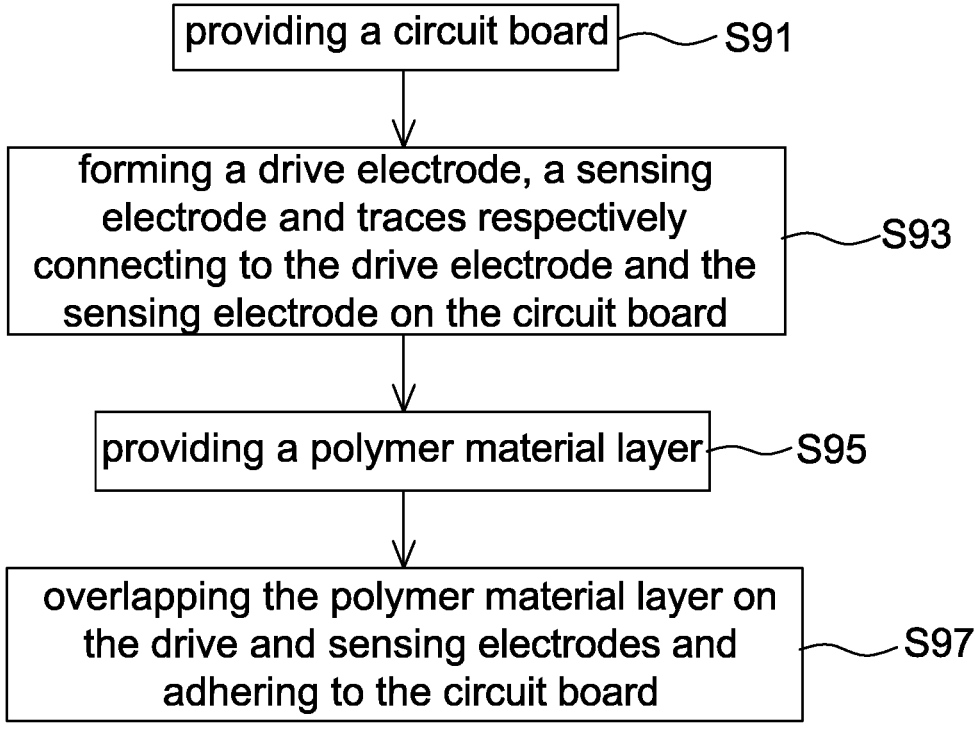
FIG. 9 is a flow chart of a manufacturing method of a force sensor according to one embodiment of the present disclosure.

Referring to FIG. 9, it is a flow chart of a manufacturing method of a force sensor according to one embodiment of the present disclosure, including the steps of: providing a circuit board (Step S91); forming a drive electrode, a sensing electrode and traces respectively connecting to the drive electrode and the sensing electrode on the circuit board (Step S93); providing a polymer material layer (Step S95); and overlapping the polymer material layer on the drive electrode and the sensing electrode and adhering to the circuit board (Step S97).

Referring to FIGS. 3 and 9 together, one aspect of this embodiment is described below.

Step S91: At first, a PCB or FCB is provided, and the circuit traces, electrodes and electrical contacts thereon are determined.

Step S93: Next, the drive electrode 211, the sensing electrode 213 and traces 215, 217 respectively connecting to the drive electrode 211 and the sensing electrode 213 are laid on the substrate 21 using the circuit board manufacturing process. It is appreciated that other traces and electrical contacts are also laid on the circuit board 21. The method of manufacturing a circuit board is known to the art, and thus details thereof are not repeated herein. As the drive electrode 211 and the sensing electrode 213 are already formed on the circuit board 21, an additional connector is no longer required.

Step S95: Next, at least one polymer material layer 23 is provided. The size and shape of the polymer material layer 23 are previously determined according to the range and pattern of the drive electrode 211 and the sensing electrode 213. Then, an adhesive layer 231 is arranged, e.g., coated or adhered, at a proper position on the polymer material layer 23. Accordingly to different electrode patterns, the adhesive layer 231 is arranged at different positions on the polymer material layer 23. In another aspect, the adhesive layer 231 is firstly arranged on the substrate 21 and then adhered to the polymer material layer 23 when combining the substrate 21 and the polymer material layer 23.

When the polymer material layer 23 is carried on a carrying layer, as shown in FIG. 8, the adhesive layer 231 could be selected to be arranged on the carrying layer. The bump 25 is arranged, optionally, on a surface of the carrying layer, and said surface does not face the substrate 21.

Step S97: Finally, the force sensor of the present disclosure is accomplished only by overlapping the polymer material layer 23 on the drive electrode 211 and the sensing electrode 231 and by adhering the polymer material layer 23 to the circuit board 21.

In addition, the bump 25 is arranged, optionally, on a surface of the polymer material layer 23 not facing the circuit board 21, wherein the number, size and position of the bump 25 are determined corresponding to the electrode configuration.

It should be mentioned that although the polymer material layer in figures of the present disclosure is shown to have a plane surface that faces the substrate, it is not to limit the present disclosure. In other embodiments, when the polymer material layer is attached to the electrodes, a part of the polymer material layer extends into a space between the electrodes, i.e., a surface of the polymer material layer facing the substrate is not a plane surface. The part of the polymer material layer attached to the electrodes is thinner, and the rest part of the polymer material layer between the electrodes is thicker.

It is appreciated that the number of components such as a number of the electrodes, traces, bumps, polymer material layers and adhesive layers herein are only intended to illustrate but not to limit the present disclosure.

As mentioned above, the conventional force sensor is not directly integrated with a circuit board such that an additional connector is required to connect said conventional force sensor to the circuit board. Accordingly, the present disclosure further provides a force sensor (e.g., FIGS. 2-8) and a manufacturing method thereof (e.g., FIG. 9). The drive electrode and the sensing electrode of the force sensor are formed on the circuit board together with the manufacturing of the circuit board. Finally, the manufacturing of the force sensor is accomplished only by attaching and adhering a polymer material layer to an electrode region such that the force sensor of the present disclosure has a simple manufacturing process and low cost.

Although the disclosure has been explained in relation to its preferred embodiment, it is not used to limit the disclosure. It is to be understood that many other possible modifications and variations can be made by those skilled in the art without departing from the spirit and scope of the disclosure as hereinafter claimed.

What is claimed is:

1. A force sensor, comprising:
a substrate laid with a drive electrode and a sensing electrode on a surface thereof, wherein the drive electrode and the sensing electrode are at a same layer on the surface of the substrate, the drive electrode comprises multiple first arc traces arranged in a radial direction and the sensing electrode comprises multiple second arc traces arranged in the radial direction, and each of the first arc traces is sandwiched between two second arc traces in the radial direction or each of the second arc traces is sandwiched between two first arc traces in the radial direction;
a polymer material layer covering on the drive electrode and the sensing electrode, and in contact with surfaces of the drive electrode and the sensing electrode;
an adhesive layer configured to adhere the polymer material layer to the substrate; and
a carrying layer attached to a surface of the polymer material layer, and an area of the carrying layer is larger than that of the polymer material layer.

2. The force sensor as claimed in claim 1, wherein the adhesive layer is arranged at an edge area of the carrying layer, and in contact with the surface of the substrate.

3. The force sensor as claimed in claim 1, further comprising a bump arranged on a surface of the carrying layer.

4. The force sensor as claimed in claim 3, wherein a cross sectional area of the bump is equal to or smaller than the polymer material layer.

5. The force sensor as claimed in claim 1, wherein the substrate is further laid with a metal layer on the surface thereof configured to be adhered with the adhesive layer.

6. The force sensor as claimed in claim 1, wherein
the polymer material layer is repeatedly attachable to and detachable from the substrate via the adhesive layer, and
the polymer material layer further covers on a space between the drive electrode and the sensing electrode.

7. The force sensor as claimed in claim 1, wherein the adhesive layer is arranged on the carrying layer.

8. A force sensor, comprising:
a substrate laid with a drive electrode and a sensing electrode on a surface thereof, wherein the drive electrode and the sensing electrode are at a same layer on the surface of the substrate, the drive electrode comprises a first semi-circular trace and multiple first linear traces extending out from an inner edge of the first semi-circular trace and the sensing electrode comprises a second semi-circular trace and multiple second linear traces extending out from an inner edge of the second semi-circular trace, and the multiple first linear traces and the multiple second linear traces are interlacedly arranged between the first semi-circular trace and the second semi-circular trace;
a polymer material layer covering on the drive electrode and the sensing electrode, and in contact with surfaces of the drive electrode and the sensing electrode;
an adhesive layer configured to adhere the polymer material layer to the substrate; and a carrying layer attached to a surface of the polymer material layer, and an area of the carrying layer is larger than that of the polymer material layer.

9. The force sensor as claimed in claim 8, wherein the adhesive layer is arranged at an edge area of the carrying layer, and in contact with the surface of the substrate.

10. The force sensor as claimed in claim 8, further comprising a bump arranged on a surface of the carrying layer.

11. The force sensor as claimed in claim 10, wherein a cross sectional area of the bump is equal to or smaller than the polymer material layer.

12. The force sensor as claimed in claim 8, wherein the substrate is further laid with a metal layer on the surface thereof configured to be adhered with the adhesive layer.

13. The force sensor as claimed in claim 8, wherein the polymer material layer is repeatedly attachable to and detachable from the substrate via the adhesive layer, and the polymer material layer further covers on a space between the drive electrode and the sensing electrode.

14. The force sensor as claimed in claim 8, wherein the adhesive layer is arranged on the carrying layer.

15. A force sensor, comprising:

a substrate laid with multiple sets of drive electrodes and sensing electrodes on a surface thereof, wherein the multiple sets of drive electrodes and sensing electrodes are at a same layer on the surface of the substrate, and each set of drive electrode and sensing electrode comprises interlaced drive traces and sensing traces;

a polymer material layer adhering to the substrate and covering on the multiple sets of drive electrodes and sensing electrodes, and in contact with surfaces of the multiple sets of drive electrodes and sensing electrodes;

an adhesive layer configured for adhering the polymer material layer to the substrate, and in contact with the surface of the substrate; and multiple bumps arranged on a surface of the polymer material layer, wherein each of the multiple bumps corresponds to one set of drive electrode and sensing electrode among the multiple sets of drive electrodes and sensing electrodes.

16. A force sensor, comprising:

a substrate laid with multiple sets of drive electrodes and sensing electrodes on a surface thereof, wherein the multiple sets of drive electrodes and sensing electrodes are at a same layer on the surface of the substrate, and each set of drive electrode and sensing electrode comprises interlaced drive traces and sensing traces;

a polymer material layer adhering to the substrate and covering on the multiple sets of drive electrodes and sensing electrodes, and in contact with surfaces of the multiple sets of drive electrodes and sensing electrodes;

an adhesive layer configured for adhering the polymer material layer to the substrate, and in contact with the surface of the substrate; and a carrying layer arranged at a surface of the polymer material layer.

* * * * *